(12) United States Patent
Lin et al.

(10) Patent No.: US 7,078,736 B2
(45) Date of Patent: Jul. 18, 2006

(54) LIGHT EMITTING DEVICE WITH A PHOTONIC CRYSTAL

(75) Inventors: Chung-Hsiang Lin, Taipei (TW); Chia-Feng Lin, Taichung (TW)

(73) Assignee: Han Shin Company, Ltd., Taipei (TW)

( * ) Notice: Subject to any disclaimer, the term of this patent is extended or adjusted under 35 U.S.C. 154(b) by 1 day.

(21) Appl. No.: 10/856,210

(22) Filed: May 27, 2004

(65) Prior Publication Data

US 2005/0151145 A1    Jul. 14, 2005

(30) Foreign Application Priority Data

Jan. 8, 2004 (TW) ............... 93100472 A
Jan. 8, 2004 (TW) ............... 93100473 A (51) Int. Cl.
*H01L 33/00* (2006.01)

(52) U.S. Cl. .......................... 257/98; 438/22

(58) Field of Classification Search ................ 257/13, 257/79, 82, 88, 98; 438/22, 24, 46, 47
See application file for complete search history.

(56) References Cited

U.S. PATENT DOCUMENTS 6,831,302 B1 * 12/2004 Erchak et al. ............. 257/87

* cited by examiner

*Primary Examiner*—David Vu
(74) *Attorney, Agent, or Firm*—Allston L. Jones (57) ABSTRACT

A light emitting device includes a photonic crystal having a periodic pattern of elements exhibiting a spectrum of electromagnetic modes that includes guided modes of frequencies below a predetermined cutoff frequency, and radiation modes of frequencies below and above the cutoff frequency. A radiation source is associated with the photonic crystal. Each of the elements is covered by a reflective layer so as to introduce at least an omnidirectional photonic band gap between the guided modes and so as to permit coupling of the radiation to the radiation modes rather than to the guided modes.

17 Claims, 9 Drawing Sheets

LIGHT EMITTING DEVICE WITH A PHOTONIC CRYSTAL

CROSS-REFERENCE TO RELATED APPLICATION

This application claims priority of Taiwanese Application No. 093100472, filed on Jan. 8, 2004 and Taiwanese Application No. 093100473, filed on Jan. 8, 2004.

BACKGROUND OF THE INVENTION

1. Field of the Invention

This invention relates to a light emitting device with a photonic crystal that exhibits at least an omnidirectional photonic band gap for a predetermined range of frequencies of electromagnetic radiation.

2. Description of the Related Art

U.S. Pat. No. 5,955,749 discloses a light emitting device including a dielectric structure that has at least a two-dimensional periodic variation in dielectric constant, and a radiation source that generates radiation within the dielectric structure. The dielectric structure exhibits a spectrum of electromagnetic modes including guided modes of frequencies below a predetermined cutoff frequency, and radiation modes of frequencies below and above the cutoff frequency. The guided modes correspond to those frequencies of electromagnetic radiation which are propagated in any direction in the plane of the dielectric structure. The radiation modes correspond to those frequencies which are propagated outside the dielectric structure. The two-dimensional periodic variation in dielectric constant introduces a photonic band gap between the guided modes, which permits coupling of the radiation resulting from the radiation source to the radiation modes rather than to the guided modes, thereby resulting in radiation extraction from the dielectric structure. The dielectric structure includes a periodic pattern of elements which introduce the band gap between the guided modes. The elements can be a periodic pattern of holes in a layer or a periodic pattern of posts spaced apart by inter spaces. The layer or each of the posts includes an n-type semiconductor layer, an active layer or a quantum well, and a p-type semiconductor layer.

Although the aforesaid conventional light emitting device can enhance the light emission efficiency, the introduced photonic band structure doesn't show a wide omnidirectional band gap. Especially, when the emitting light is unpolarized, the enhancement of the light extraction efficiency is limited.

U.S. patent application Publication No. US 2003/0141507, invented by Krames et at., discloses a light emitting diode (LED) using a photonic crystal structure. The light emitting diode includes a periodic structure, such as a lattice of holes, formed in the semiconductor layers of the LED. The parameters of the periodic structure are such that the energy of the photons, emitted by the LED, lies close to a band edge of the band structure of the periodic structure. The light emitting diode includes a first semiconductor layer coupled to a first electrode layer, an active layer overlying the first semiconductor layer, a second semiconductor layer overlying the active layer, and a second electrode layer overlying the second semiconductor layer. Although Krames et al. mentioned that the metal electrode layers, which respectively overlie the first and second semiconductor layers, have a strong influence on the emission efficiency of the light emitting diode, there is no discussion as to their influence on the band gap in the band structure of the periodic structure.

The entire disclosures of U.S. Pat. No. 5,955,749 and U.S. patent application Publication No. US 2003/0141507 are hereby incorporated herein by reference.

SUMMARY OF THE INVENTION

The object of the present invention is to provide a light emitting device with a photonic crystal having a periodic pattern of elements which are covered by a reflective layer that permits the presence of an omnidirectional photonic band gap in the band structure of the composite photonic crystal for a predetermined range of frequencies of electromagnetic radiation.

According to the present invention, there is provided a light emitting device that comprises: a photonic crystal including a periodic pattern of elements that imparts a periodic variation in dielectric constant to the photonic crystal, the periodic variation in dielectric constant exhibiting a spectrum of electromagnetic modes that includes guided modes of frequencies below a predetermined cutoff frequency, and radiation modes of frequencies below and above the cutoff frequency; and a radiation source associated with the photonic crystal in such a manner so as to generate electromagnetic radiation within the photonic crystal. Each of the elements is covered by a reflective layer in such a manner so as to introduce at least an omnidirectional photonic band gap between the guided modes for a frequency range of the radiation generated by the radiation source and so as to permit coupling of the radiation for the frequency range to the radiation modes rather than to the guided modes, thereby resulting in radiation extraction from the photonic crystal.

BRIEF DESCRIPTION OF THE DRAWINGS

In drawings which illustrate embodiments of the invention.

DETAILED DESCRIPTION OF THE PREFERRED EMBODIMENTS

For the sake of brevity, like elements are denoted by the same reference numerals throughout the disclosure.

Figure 1:
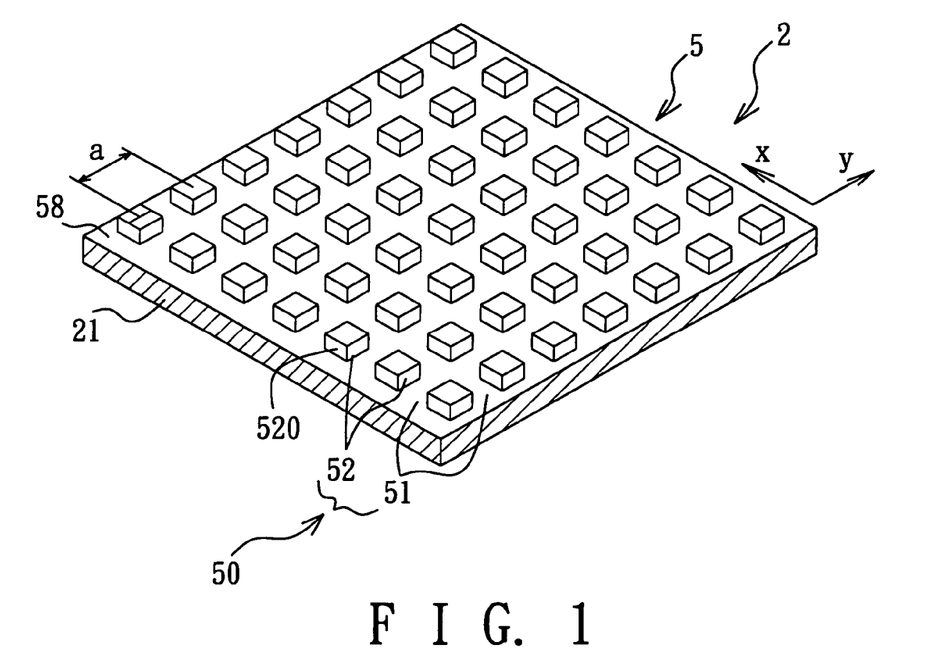
FIG. 1 is a schematic perspective view of the first preferred embodiment of a light emitting device according to this invention.
Figure 2:
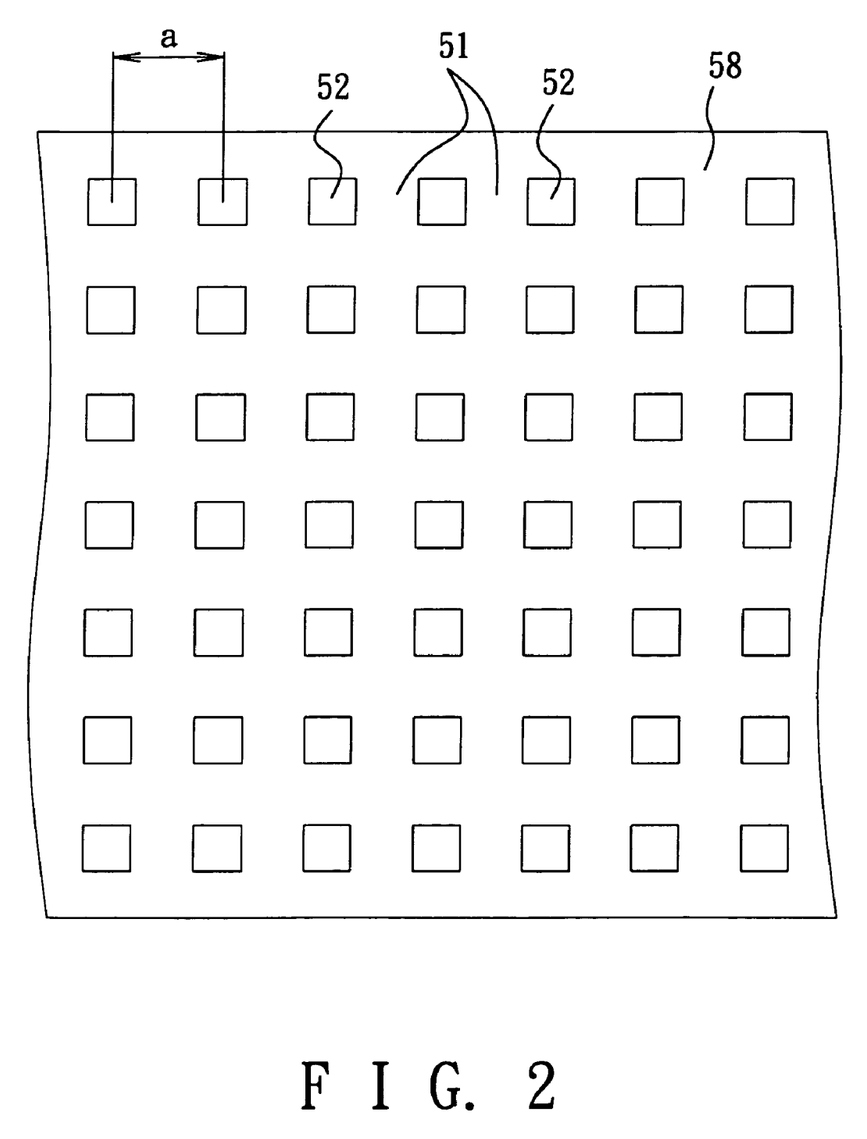
FIG. 2 is a schematic top view of the first preferred embodiment.
Figure 3:
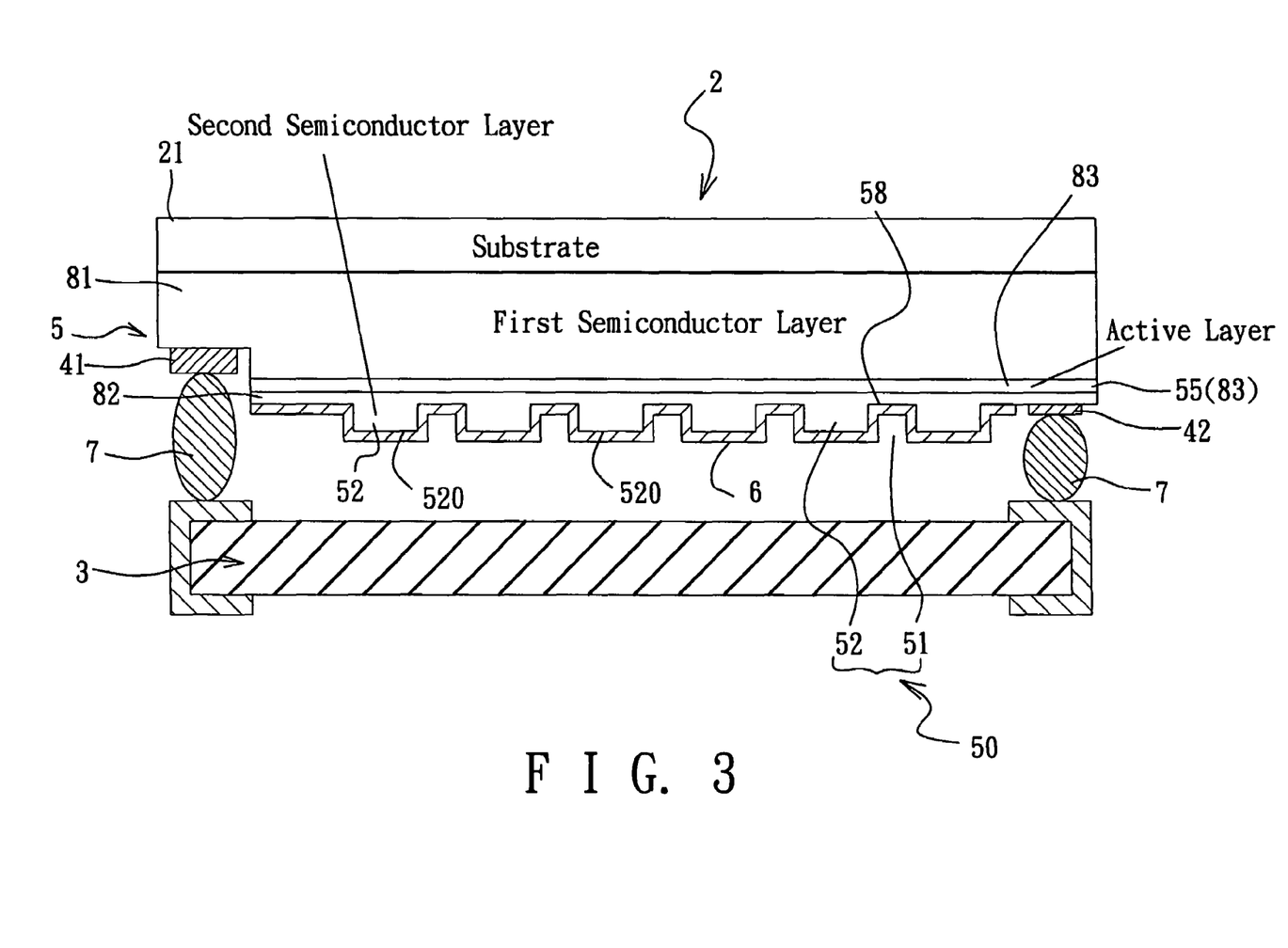
FIG. 3 is a schematic sectional view to illustrate a photonic crystal of the light emitting device of the first preferred embodiment.

FIGS. 1 to 3 illustrate the first preferred embodiment of a light emitting device 2 according to the present invention. The light emitting device 2 includes: a transparent substrate 21; a photonic crystal 5 formed on the substrate 21 and including a periodic pattern of elements 50 that imparts a periodic variation in dielectric constant to the photonic crystal 5, the periodic variation in dielectric constant exhibiting a spectrum of electromagnetic modes that includes guided modes (indicated as solid dots in FIG. 4) of frequencies below a predetermined cutoff frequency (see the dash line in FIG. 4), and radiation modes (see the shaded area in FIG. 4) of frequencies below and above the cutoff frequency (As defined herein, the cutoff frequency represents the upper frequency limit of the guided modes); and a radiation source 55 associated with the photonic crystal 5 in such a manner so as to generate electromagnetic radiation within the photonic crystal 5. In the first preferred embodiment, the cutoff frequency is determined when the transparent substrate 21 has the refraction index n=1.7 (when the substrate is sapphire). Each of the elements 50 is covered by a reflective layer 6 (see FIG. 3) in such a manner so as to introduce at least an omnidirectional photonic band gap (see the dotted lines in FIG. 4) along a x-y plane between the guided modes for a frequency range of the radiation generated from the radiation source 55 and so as to permit coupling of the radiation for the frequency range to the radiation modes rather than to the guided modes, thereby resulting in radiation extraction from the photonic crystal 5.

Figure 4:
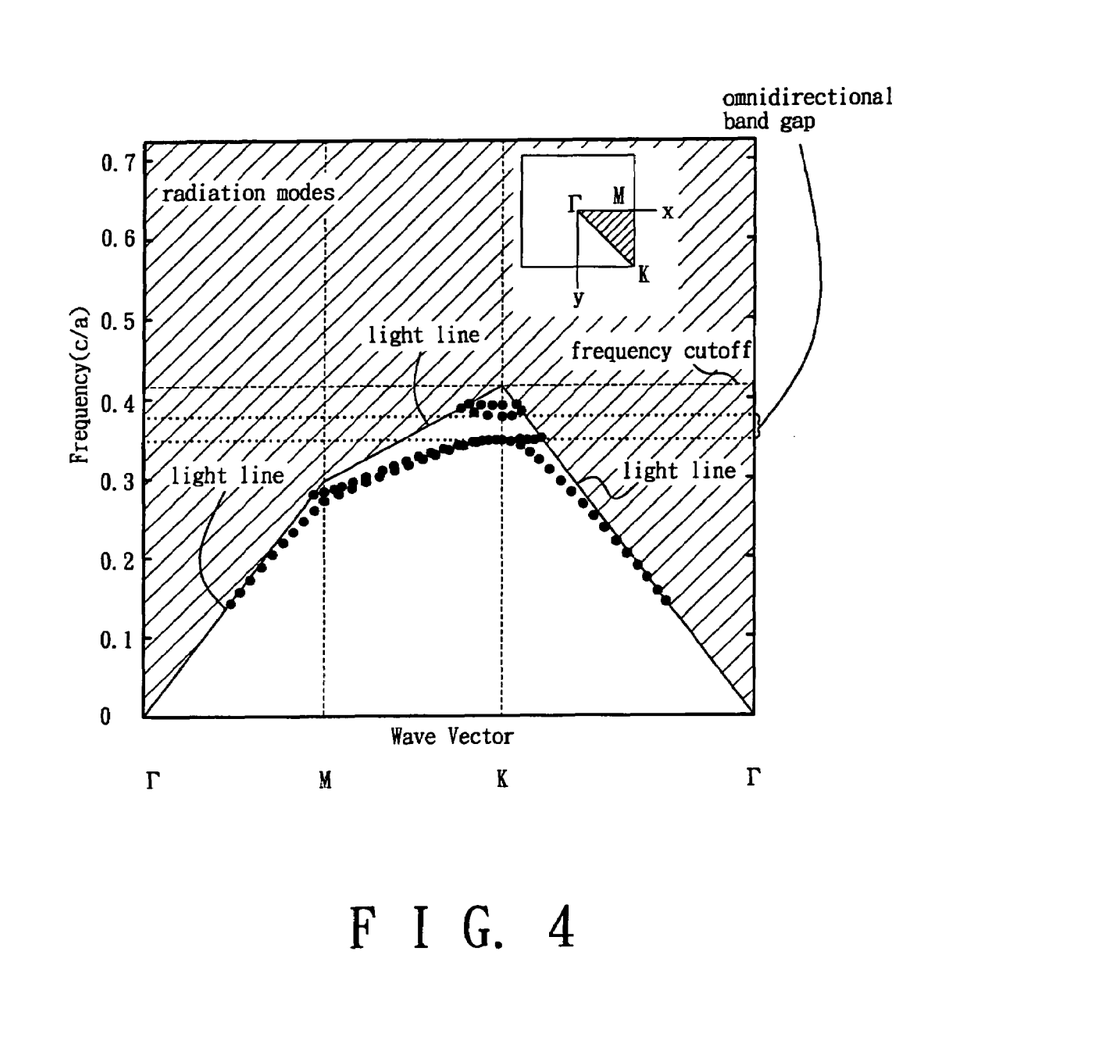
FIG. 4 is a plot showing the dispersion relation of the guided modes in a photonic band structure of the photonic crystal of the first preferred embodiment.
Figure 5:
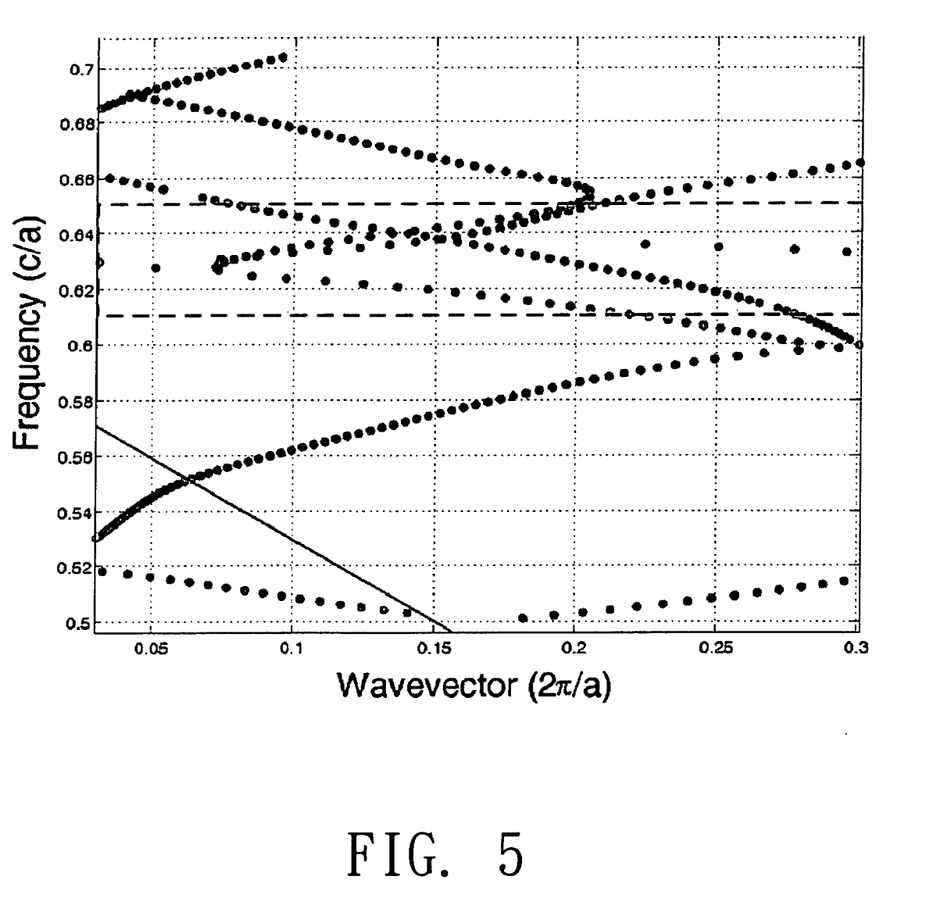
FIG. 5 is plot showing the leaky bands in a photonic band structure of the photonic crystal of the first preferred embodiment.

In this embodiment, the photonic crystal 5 is bonded to the substrate 21, and has a floor surface 58 (note that the reflective layer 6 shown in FIG. 3 is removed from the photonic crystal 5 shown in FIGS. 1 and 2 for the purpose of exposing the floor surface 58) that is opposite to the substrate 21 and that is formed with the elements 50. The elements 50 include spaced apart posts 52 that protrude from the floor surface 58 of the photonic crystal 5 in a direction away from the substrate 21, and inter spaces 51 that are disposed among the posts 52 and that space apart the posts 52. Each of the posts 52 has an outer surface 520 extending from the floor surface 58. The reflective layer 6 is formed on and covers the floor surface 58 of the photonic crystal 5 and the outer surfaces 520 of the posts 52. Note that the photonic band structures shown in FIGS. 4 and 5 are calculated by treating the reflective layer 6 as a perfect electric conductor.

The photonic crystal 5 includes first and second semiconductor layers 81, 82 and an active layer 83 (or a quantum well) sandwiched between the first and second semiconductor layers 81, 82. In this embodiment, the first semiconductor layer 81 is an n-GaN layer, the second semiconductor layer 82 is a p-GaN layer, and the active layer 83 is an InGaN layer. The active layer 83 serves as the radiation source 55. The first semiconductor layer 81 is bonded to the substrate 21. The second semiconductor layer 82 cooperates with the first semiconductor layer 81 to define a p-n junction therebetween. The second semiconductor layer 82 is etched inwardly to the floor surface 58 of the photonic crystal 5 so as to form the posts 52 and the inter spaces 51.

The light emitting device 2 further includes a first electrode 41 that is formed on the first semiconductor layer 81, and a second electrode 42 that is formed on the second semiconductor layer 82 and that is connected to the reflective layer 6. Preferably, a heat dissipating member 3 is connected to the first and second electrodes 41, 42 through two connecting members 7 for dissipating heat resulting from operation of the light emitting device 2.

In this embodiment, the periodic pattern of the elements 50 is two-dimensional, and has a square lattice. The aforesaid lattice structure is not limited to being square, and can have other structures, such as, hexagonal, honeycomb and other well-known two dimensional lattices. Although each of the posts 52 has a square cross-section in this embodiment, they can be shaped to have other cross-sections, such as circular cross-section.

Preferably, the reflective layer 6 is made from a highly reflective metallic material selected from the group consisting of silver, aluminum, nickel, titanium, and chromium.

FIG. 4 shows the band structure of the photonic crystal 5 (i.e., the refraction index n=2.4) having a thickness of 0.5a of the light emitting device 2 for the first embodiment with each post 52 having a height of 0.3a (i.e., the height relative to the floor surface 58 of the photonic crystal 5) and a side length of 0.5a (i.e., the side length of each side of a square post), wherein a is the lattice constant of the square lattice of the periodic elements 50 of the photonic crystal 5. The omnidirectional photonic band gap between the guided modes (i.e., the solid dots within the light lines and below the cutoff frequency in FIG. 4) extends from about 0.35c/a to about 0.38c/a (see the upper and lower dotted lines in FIG. 4), wherein c is the speed of light. Within the band gap (i.e., a frequency range from about 0.35c/a to about 0.38c/a), no guided modes can exist. As a consequence, the radiation at the frequency range in the photonic crystal 5 can be completely extracted therefrom, thereby considerably enhancing the emission efficiency of the light emitting device 2.

FIG. 5 shows the band structure of the photonic crystal 5 of the light emitting device 2 in the radiation mode region in Γ-M direction for the first embodiment. Flat leaky bands (i.e., a relatively high density of states that permit coupling of the radiation to the radiation modes) are observed for the photonic crystal 5, and define a bandwidth extending from about 0.61c/a to about 0.65c/a (see the upper and lower dash lines in FIG. 5). The formation of the flat leaky bands is attributed to the strong scattering effect imparted by the reflective layer 6 to the photonic crystal 5. When the radiation couples those flat leaky bands, the emission efficiency of the light emitting device 2 can be considerably enhanced.

Figure 6:
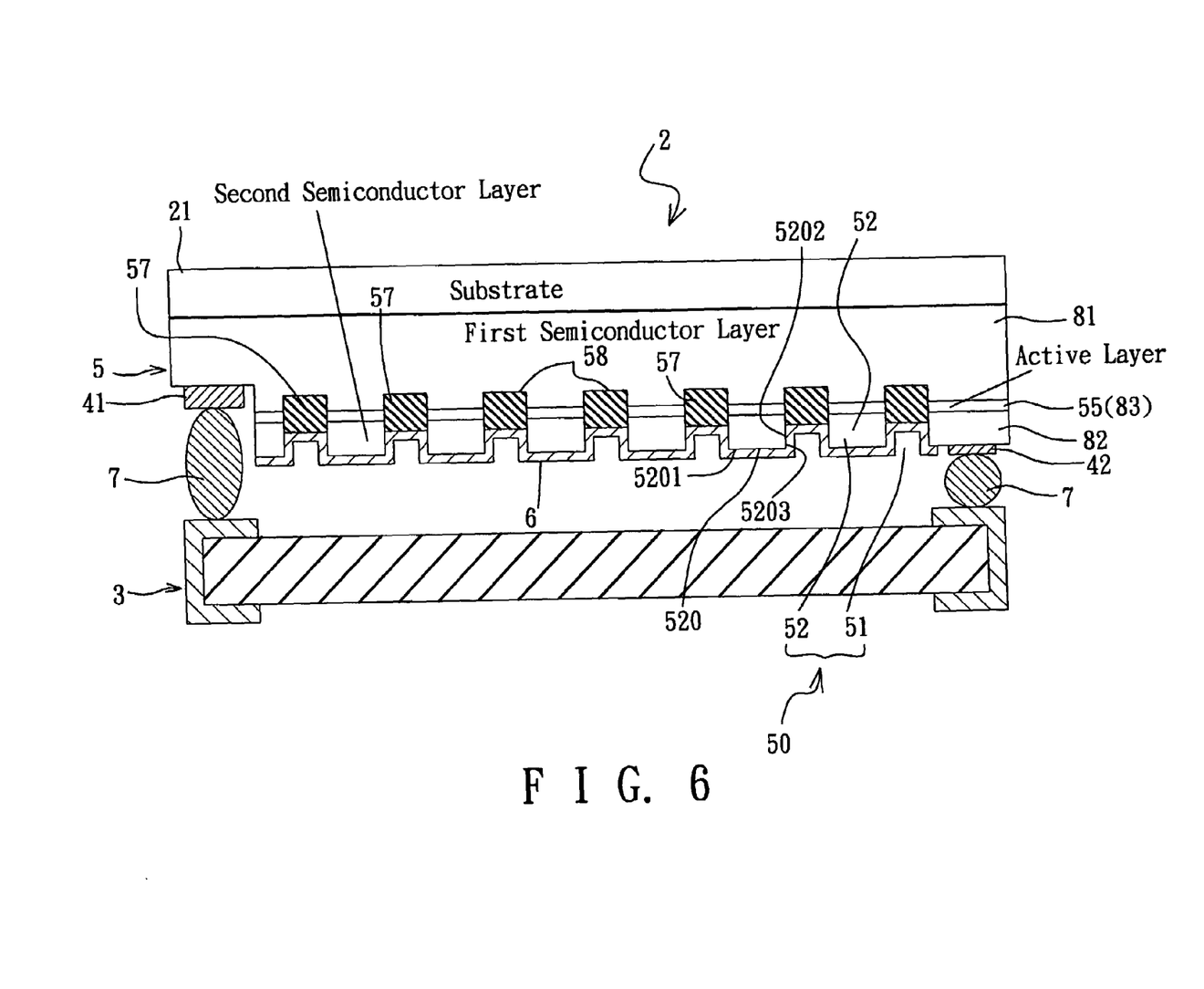
FIG. 6 is a schematic sectional view of the second preferred embodiment of the light emitting device according to this invention.

FIG. 6 illustrates the second preferred embodiment of the light emitting device 2 according to this invention. The light emitting device 2 of this embodiment is similar to the previous embodiment, except that an electrical insulating layer 57 is provided between the reflective layer 6 and the floor surface 58 of the photonic crystal 5, and that the photonic crystal 5 is etched inwardly through the second semiconductor layer 82 and the active layer 83 and into the first semiconductor layer 81 to form the posts 52 and the inter spaces 51. As such, each post 52 comprises the entire layer of the second semiconductor layer 82, the entire layer of the active layer 83, and a portion of the first semiconductor layer 81.

In this embodiment, the outer surface 520 of each post 52 has a free end portion 5201 and a side portion 5202 that is transverse to the free end portion 5201 and that extends from the free end portion 5201 to the floor surface 58 of the photonic crystal 5. The electrical insulating layer 57 is formed on and covers entirely the floor surface 58 of the photonic crystal 5, extends therefrom to a position between the active layer 83 and the free end portion 5201 of the outer surface 520 of each of the posts 52, and is bonded to the side portion 5202 of the outer surface 520 of each of the posts 52. The side portion 5202 of the outer surface 520 of each of the posts 52 has an exposed segment 5203 that is exposed from the electrical insulating layer 57 and that extends from the free end portion 5201 to the electrical insulating layer 57. The reflective layer 6 is formed on and covers the free end portion 5201 and the exposed segment 5203 of the side portion 5202 of the outer surface 520 of each of the posts 52 and the electrical insulating layer 57.

Figure 7:
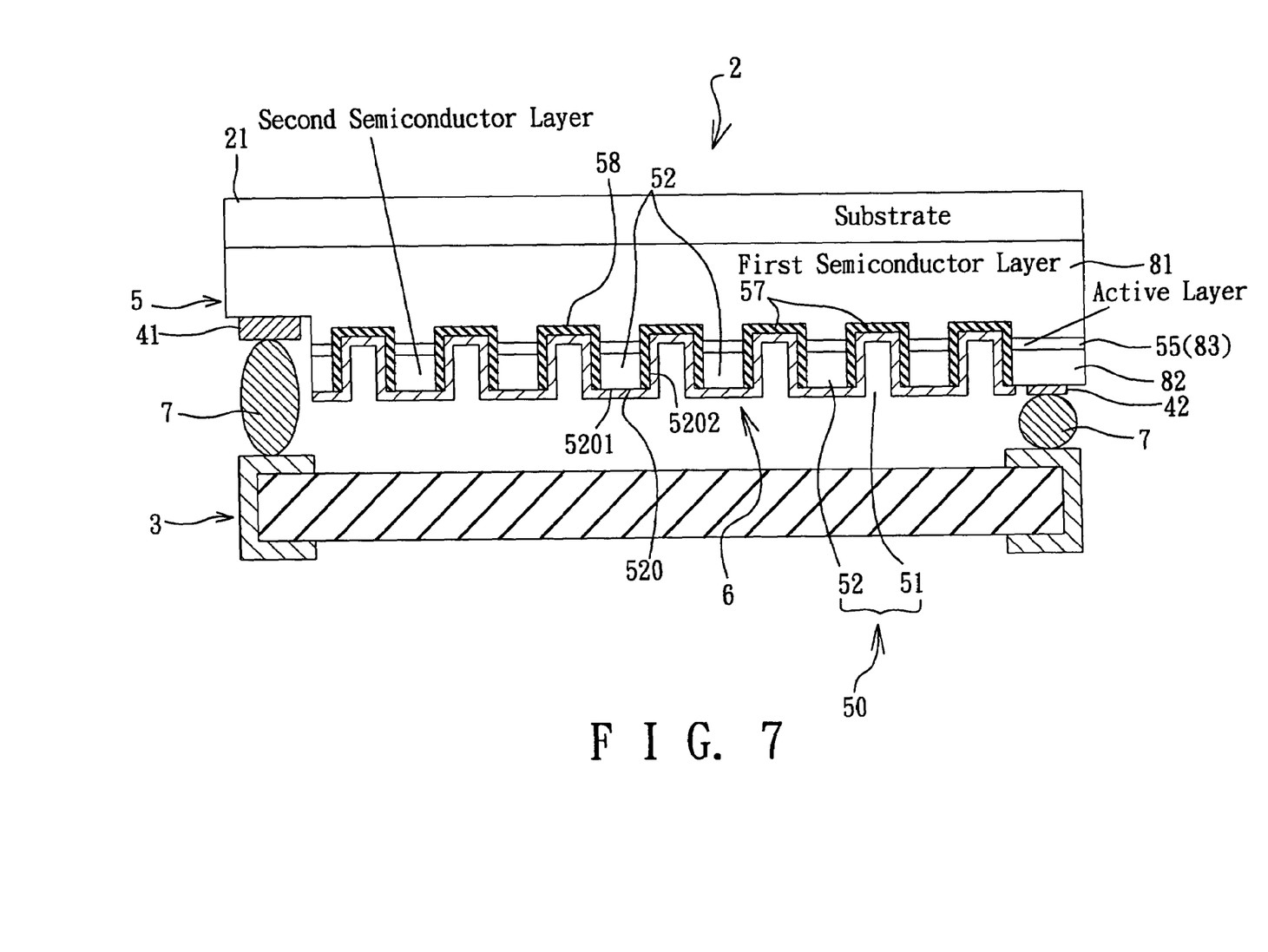
FIG. 7 is a schematic sectional view of the third preferred embodiment of the light emitting device according to this invention.

FIG. 7 illustrates the third preferred embodiment of the light emitting device 2 according to this invention. The light emitting device 2 of this embodiment is similar to the first embodiment, except that an electrical insulating layer 57 is provided between the reflective layer 6 and the floor surface 58 of photonic crystal 5, and that the photonic crystal 5 is etched inwardly through the second semiconductor layer 82 and the active layer 83 and into the first semiconductor layer 81 to form the posts 52 and the inter spaces 51. As such, each post 52 comprises the entire layer of the second semiconductor layer 82, the entire layer of the active layer 83, and a portion of the first semiconductor layer 81.

In this embodiment, the outer surface 520 of each post 52 has a free end portion 5201 and a side portion 5202 that is transverse to the free end portion 5201 and that extends from the free end portion 5201 to the floor surface 58 of the photonic crystal 5. The electrical insulating layer 57 is formed on and covers entirely the floor surface 58 of the photonic crystal 5 and the side portion 5202 of the outer surface 520 of each of the posts 52. The reflective layer 6 is formed on and covers the free end portion 5201 of the outer surface 520 of each of the posts 52 and the electrical insulating layer 57.

Figure 8:
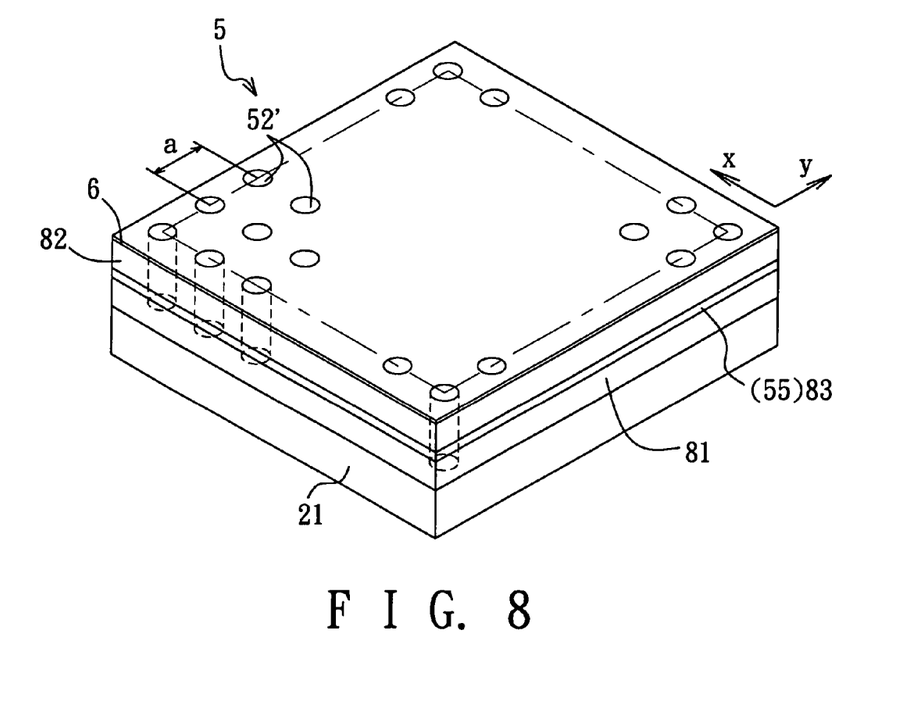
FIG. 8 is a schematic perspective view of the fourth preferred embodiment of the light emitting device according the this invention.
Figure 9:
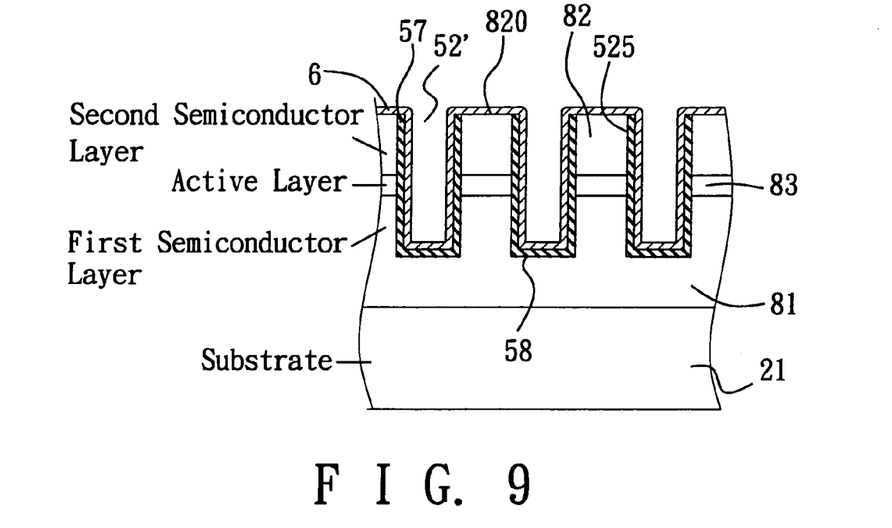
FIG. 9 is a schematic, fragmentary sectional view of the fourth preferred embodiment.

FIGS. 8 and 9 illustrate the fourth preferred embodiment of the light emitting device 2 according to this invention. The light emitting device 2 of this embodiment differs from the first embodiment in that the elements 50 include spaced apart holes 52' formed in the photonic crystal 5. Each of the holes 52' is defined by a hole-defining wall 525. An electrical insulating layer 57 is formed on the hole-defining wall 525 of each of the holes 52' in such a manner to cover at least an exposed portion of the active layer 83 that is exposed in the hole 52'. In this embodiment, each hole 52' extends from an upper surface 820 of the second semiconductor layer 82 through the second semiconductor layer 82 and the active layer 83 and into the first semiconductor layer 81. Note that modifications can be made for the dimensions of each hole 52' such as the depth of each hole 52' relative to the floor surface 58. The electrical insulating layer 57 extends from the floor surface 58 to the second semiconductor layer 82 at a level adjacent to a top end of the second semiconductor layer 82 so as to cover the exposed portion of the active layer 83. Note that the purpose of the electrical insulating layer 57 is to electrically isolate the active layer 83 and the first semiconductor layer 81 from the reflective layer 6, which is made from a metallic material. As such, the dimensions of the electrical insulating layer 57 are arbitrary as long as the active layer 83 and the first semiconductor layer 81 are isolated from the reflective layer 6. The reflective layer 6 is formed on and covers the electrical insulating layer 57 and the upper surface 820 of the second semiconductor layer 82. The periodic pattern of the holes 52' of the elements 50 has a triangular lattice.

Figure 10:
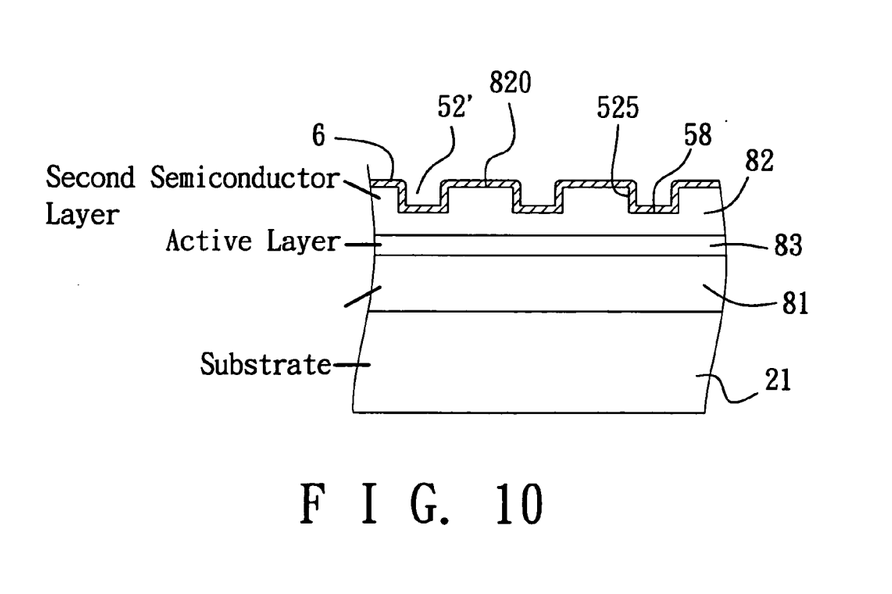
FIG. 10 is schematic, fragmentary sectional view of the fifth preferred embodiment.

FIG. 10 illustrates the fifth preferred embodiment of the light emitting device 2 according to this invention. The light emitting device 2 of this embodiment differs from the fourth embodiment in that each hole only 52' extends from the upper surface 820 of the second semiconductor layer 82 into the semiconductor layer 82 and that the electrical insulating layer 57 of the fourth embodiment is dispensed with in this embodiment. The reflective layer 6 covers the floor surface 58, the hole-defining wall 525 of each of the holes 52', and the upper surface 820 of the second semiconductor layer 82.

With the inclusion of the reflective layer 6, which is provided on the periodic pattern of the elements 50, in the photonic crystal 5 of the light emitting device 2 of this invention, the emission efficiency of the light emitting device 2 can be enhanced as compared to those of the prior art.

With the invention thus explained, it is apparent that various modifications and variations can be made without departing from the spirit of the present invention.

We claim:

1. A light emitting device comprising:
a photonic crystal including a periodic pattern of elements that imparts a periodic variation in dielectric constant to said photonic crystal, said periodic variation in dielectric constant exhibiting a spectrum of electromagnetic modes that includes guided modes of frequencies below a predetermined cutoff frequency, and radiation modes of frequencies below and above the cutoff frequency; and
a radiation source associated with said photonic crystal in such a manner so as to generate electromagnetic radiation within said photonic crystal;
each of said elements being covered by a reflective layer in such a manner so as to introduce at least an omni-directional photonic band gap between said guided modes for a frequency range of the radiation generated by said radiation source and so as to permit coupling of the radiation for said frequency range to said radiation modes rather than to said guided modes, thereby resulting in radiation extraction from said photonic crystal.

2. The light emitting device of claim 1, further comprising a transparent substrate, said photonic crystal being bonded to said substrate and having a floor surface that is opposite to said substrate and that is formed with said elements, said elements including spaced apart posts that protrude from said floor surface of said photonic crystal in a direction away from said substrate, and inter spaces that are disposed among said posts and that space apart said posts, each of said posts having an outer surface extending from said floor surface, said reflective layer being formed on and covering said floor surface of said photonic crystal and said outer surfaces of said posts.

3. The light emitting device of claim 2, wherein said photonic crystal includes first and second semiconductor layers and an active layer sandwiched between said first and second semiconductor layers, said first semiconductor layer being bonded to said substrate, said second semiconductor layer cooperating with said first semiconductor layer to define a p-n junction therebetween, said second semiconductor layer being etched inwardly to said floor surface of said photonic crystal so as to form said posts and said inter spaces.

4. The light emitting device of claim 3, further comprising a first electrode that is formed on said first semiconductor layer, and a second electrode that is formed on said second semiconductor layer and that is connected to said reflective layer.

5. The light emitting device of claim 4, further comprising a heat dissipating member that is connected to said first and second electrodes.

6. The light emitting device of claim 2, wherein said periodic pattern of said elements is two-dimensional and has a square lattice.

7. The light emitting device of claim 1, wherein said reflective layer is made from a metallic material selected from the group consisting of silver, aluminum, nickel, titanium, and chromium.

8. The light emitting device of claim 1, further comprising a transparent substrate, said photonic crystal being bonded to said substrate and having a floor surface that is opposite to said substrate and that is formed with said elements, said elements including spaced apart posts that protrude from said floor surface of said photonic crystal in a direction away from said substrate, and inter spaces that are disposed among said posts and that space apart said posts, each of said posts having an outer surface that has a free end portion and a side portion transverse to said free end portion and extending from said free end portion to said floor surface of said photonic crystal, said light emitting device further comprising an electrical insulating layer that is formed on and that covers said floor surface of said photonic crystal, that extends therefrom in a direction toward said free end portion of said outer surface of each of said posts, and that is bonded to said side portion of said outer surface of each of said posts, said side portion of said outer surface of each of said posts having an exposed segment that is exposed from said electrical insulating layer and that extends from said free end portion to said electrical insulating layer, said reflective layer being formed on and covering said free end portion and said exposed segment of said side portion of said outer surface of each of said posts and said electrical insulating layer.

9. The light emitting device of claim 8, wherein said photonic crystal includes first and second semiconductor layers and an active layer sandwiched between said first and second semiconductor layers, said first semiconductor layer being bonded to said substrate, said second semiconductor layer cooperating with said first semiconductor layer to define a p-n junction therebetween, said photonic crystal being etched inwardly through said second semiconductor layer and said active layer and into said first semiconductor layer to form said posts and said inter spaces, said electrical insulating layer extending from said floor surface of said photonic crystal to a position between said active layer and said free end portion of said outer surface of each of said posts.

10. The light emitting device of claim 9, wherein said reflective layer is made from a metallic material selected from the group consisting of silver, aluminum, nickel, titanium, and chromium.

11. The light emitting device of claim 1, further comprising a transparent substrate, said photonic crystal being bonded to said substrate and having a floor surface that is opposite to said substrate and that is formed with said elements, said elements including spaced apart posts that protrude from said floor surface of said photonic crystal in a direction away from said substrate, and inter spaces that are disposed among said posts and that space apart said posts, each of said posts having an outer surface that has a free end portion and a side portion transverse to said free end portion and extending from said free end portion to said floor surface of said photonic crystal, said light emitting device further comprising an electrical insulating layer that is formed on and that covers said floor surface of said photonic crystal and said side portion of said outer surface of each of said posts, said reflective layer being formed on and covering said free end portion of said outer surface of each of said posts and said electrical insulating layer.

12. The light emitting device of claim 11, wherein said photonic crystal includes first and second semiconductor layers and an active layer sandwiched between said first and second semiconductor layers, said first semiconductor layer being bonded to said substrate, said second semiconductor layer cooperating with said first semiconductor layer to define a p-n junction therebetween, said photonic crystal being etched inwardly through said second semiconductor layer and said active layer and into said first semiconductor layer to form said posts and said inter spaces.

13. The light emitting device of claim 12, wherein said reflective layer is made from a metallic material selected from the group consisting of silver, aluminum, nickel, titanium, and chromium.

14. The light emitting device of claim 1, further comprising a transparent substrate, said photonic crystal being bonded to said substrate and having a floor surface that is opposite to said substrate, said elements including spaced apart holes that are formed in said photonic crystal, each of said holes being defined by a hole-defining wall, said reflective layer being formed on and covering at least a portion of said hole-defining wall of each of said holes.

15. The light emitting device of claim 14, wherein said photonic crystal includes first and second semiconductor layers and an active layer sandwiched between said first and second semiconductor layers, said first semiconductor layer being bonded to said substrate, said second semiconductor layer having an upper surface and cooperating with said first semiconductor layer to define a p-n junction therebetween, each of said holes extending from said upper surface of said second semiconductor layer through said second semiconductor layer and said active layer and into said first semiconductor layer, said light emitting device further comprising an insulating layer that is formed on said floor surface and that covers an exposed portion of said active layer that is exposed in each of said holes, said reflective layer covering said insulating layer and said upper surface of said second semiconductor layer.

16. The light emitting device of claim 15, wherein said reflective layer is made from a metallic material selected from the group consisting of silver, aluminum, nickel, titanium, and chromium.

17. The light emitting device of claim 14, wherein said photonic crystal includes first and second semiconductor layers and an active layer sandwiched between said first and second semiconductor layers, said first semiconductor layer being bonded to said substrate, said second semiconductor layer having an upper surface and cooperating with said first semiconductor layer to define a p-n junction therebetween, each of said holes extending from said upper surface of said second semiconductor layer into said second semiconductor layer, said reflective layer covering said floor surface, said hole-defining wall of each of said holes, and said upper surface of said second semiconductor layer.

* * * * *